(12) United States Patent
Tendulkar

(10) Patent No.: US 9,243,321 B2
(45) Date of Patent: Jan. 26, 2016

(54) TERNARY METAL NITRIDE FORMATION BY ANNEALING CONSTITUENT LAYERS

(71) Applicant: Intermolecular Inc., San Jose, CA (US)

(72) Inventor: Mihir Tendulkar, Mountain View, CA (US)

(73) Assignee: Intermolecular, Inc., San Jose, CA (US)

( * ) Notice: Subject to any disclaimer, the term of this patent is extended or adjusted under 35 U.S.C. 154(b) by 115 days.

(21) Appl. No.: 14/143,358

(22) Filed: Dec. 30, 2013

(65) Prior Publication Data

US 2015/0184283 A1 Jul. 2, 2015

(51) Int. Cl.
| | | |
|---|---|---|
| *H01L 21/44* | (2006.01) | |
| *C23C 14/58* | (2006.01) | |
| *C23C 14/06* | (2006.01) | |
| *C23C 14/35* | (2006.01) | |
| *H01L 21/3205* | (2006.01) | |

(52) U.S. Cl.
CPC ......... *C23C 14/5806* (2013.01); *C23C 14/0641* (2013.01); *C23C 14/351* (2013.01); *C23C 14/352* (2013.01); *H01L 21/32051* (2013.01); *H01L 2924/1435* (2013.01)

(58) Field of Classification Search
CPC ................... H01L 21/28506; H01L 21/32055
USPC .......................................................... 438/657
See application file for complete search history.

(56) References Cited

U.S. PATENT DOCUMENTS

| | | | |
|---|---|---|---|
| 5,198,043 A * | 3/1993 | Johnson ........................ | 148/512 |
| 5,750,438 A | 5/1998 | Hsue | |
| 6,049,133 A * | 4/2000 | Hause et al. .................. | 257/767 |
| 6,147,405 A | 11/2000 | Hu | |
| 6,410,460 B1 * | 6/2002 | Shalish et al. ................ | 438/785 |
| 6,706,115 B2 | 3/2004 | Leskel | |
| 7,791,060 B2 | 9/2010 | Aochi | |
| 8,120,942 B2 | 2/2012 | Yamaguchi | |
| 8,144,498 B2 * | 3/2012 | Kumar et al. ................. | 365/148 |
| 2001/0010293 A1 * | 8/2001 | Ishida et al. .................... | 208/19 |
| 2005/0074957 A1 * | 4/2005 | Ho et al. ....................... | 438/592 |
| 2008/0115359 A1 | 5/2008 | Guan | |
| 2013/0109131 A1 * | 5/2013 | Liang .............................. | 438/95 |

OTHER PUBLICATIONS

B.B Burton et al.; Tantalum Nitride Atomic Layer Deposition Using terButylimidotrisdiethylamidotantalum and Hydrazine; Sep. 25, 2007; Department of Chemistry and Biochemistry and Department of Chemical and Biological Engineering, University of Colorado, Boulder.

Dail Eom et al.; Properties of Aluminum Nitride Thin Films Deposited by an Alternate Injection of Trimethylaluminum and Ammonia under Ultraviolet Radiation; Feb. 22, 2006; Journal of the Electrochemical Society;.

* cited by examiner

*Primary Examiner* — Chandra Chaudhari

(57) ABSTRACT

Ternary metal nitride layers suitable for thin-film resistors are fabricated by forming constituent layers of complementary components (e.g., binary nitrides of the different metals, or a binary nitride of one metal and a metallic form of the other metal), then annealing the constituent layers to interdiffuse the materials, thus forming the ternary metal nitride. The constituent layers (e.g., 2-5 nm thick) may be sputtered from binary metal nitride targets, from metal targets in a nitrogen-containing ambient, or from metal targets in an inert ambient. Optionally, a nitrogen-containing ambient may also be used for the annealing. The annealing may be 10 seconds to 10 minutes at 500-1000° C. and may also process another component on the same substrate (e.g., activate a diode).

20 Claims, 6 Drawing Sheets

TERNARY METAL NITRIDE FORMATION BY ANNEALING CONSTITUENT LAYERS

BACKGROUND

Related fields include thin-film devices, particularly the fabrication of resistive thin films including ternary metal nitrides.

Ternary metal nitrides are nitrides of the form $(m)(m')N_x$, where $x>0$ and $(m)$ and $(m')$ are different metallic elements. Some ternary metal nitrides exhibit properties desirable in a thin-film resistor, such as the ability to maintain a constant resistance over a range of operating conditions, or the ability to tune the resistance over a range of values by manipulating the thickness or composition.

For example, a type of non-volatile memory known as "resistive-switching memory" or "ReRAM" includes a variable-resistance (VR) layer that is reversibly switchable between two or more stable values of resistance. When initially fabricated, the VR layer is dielectric, with high resistance. When the device is complete, a "forming operation" applies voltage across the VR layer until it becomes more conductive. For example, electrical defects, such as metal particles or oxygen vacancies, may be present in the bulk of the VR layer, in an adjacent "source" layer, or both. The application of the forming voltage organizes some of the defects into a conductive filament, through which electrons can tunnel across the VR layer. After that, a much lower applied voltage can break or disperse part of the filament to raise the VR layer's resistance to its high resistance state (HRS) or restore the broken filament to return the VR layer's resistance to its low resistance state (LRS). In many types of ReRAM, the breaking and restoring of the filament involves only the movement, creation, or destruction of electrical defects without requiring a phase change of the bulk material.

One mode of ReRAM failure is "over-forming," the formation of a filament that is too thick or dense to break under normal operating conditions (essentially, an irreversible breakdown of the VR layer). This may occur either during the forming operation that first creates the filament or later during a switching event to restore the filament (e.g., if the current is overly high or has a transient spike, or if an overlarge number of defects are accumulated at the switching point). Once over-formed, the VR layer cannot be returned to the LRS; i.e., the memory cell can no longer be switched and its logic state cannot be rewritten.

One approach to prevent over-forming of a ReRAM cell is to connect a non-switching resistor in series with the VR layer. When the non-switching resistor is part of the film stack that constitutes the ReRAM cell, it may be referred to as an "embedded resistor" (ER). With an ER in the cell, any voltage applied to the cell's electrodes is divided between the VR and ER layers, rather than being wholly applied to the VR layer, and the current through the VR layer is limited to a level that can break a filament, or restore a breakable filament, but not create an unbreakable filament.

An ER layer in an operating ReRAM cell may have a sheet resistivity of $10^{-1}$-$10^3$ $\Omega$-cm. Thicknesses may range from 2-50 nm; a common range is 2-10 nm. Desirable qualities in a ReRAM ER layer include a constant resistance under all operating conditions for the life of the device. In some devices, it is preferred that the ER resistance is unchanged by the forming operation, or by heating to a temperature between 500-1000 C for a time between 10 seconds and 10 minutes to anneal other components such as diodes. Throughout fabrication and operation, the ER layer preferably does not interact with other layers in the stack in a way that compromises memory-cell performance. For example, its component materials should not diffuse into other layers, and it should not scavenge oxygen from metal-oxide VR layers.

Ternary metal nitrides with (m)=aluminum (Al), molybdenum (Mo), tantalum (Ta), titanium (Ti), vanadium (V), or tungsten (W) and (m')=boron (B), silicon (Si), or Al (if (m)≠Al) are promising candidate materials for ER layers. However, their use has been limited by the historical difficulty of depositing them in fully-compounded form. Some atomic layer deposition (ALD) and chemical vapor deposition (CVD) precursors for these materials are slow to react with nitrogen, requiring inconveniently long process times to form the nitride. As for sputtering (either from a nitride target or from a metal target in a nitrogen atmosphere), compound targets of these elements have been observed to deposit unwanted large particles, deposit a variable composition across a substrate due to sputter-angle sensitivity, or both.

Therefore, a need exists for a reliable, cost-effective way to deposit layers of ternary metal nitrides such as $AlBN_x$, $AlSiN_x$, $MoAlN_x$, $MoBN_x$, $MoSiN_x$, $TaAlN_x$, $TaBN_x$, $TaSiN_x$, $TiAlN_x$, $TiBN_x$, $TiSiN_x$, $VAlN_x$, $VBN_x$, $VSiN_x$, $WAlN_x$, $WBN_x$, and $WSiN_x$.

SUMMARY

The following summary presents some concepts in a simplified form as an introduction to the detailed description that follows. It does not necessarily identify key or critical elements and is not intended to reflect a scope of invention.

Methods for forming layers of ternary metal nitrides of the form $(m)(m')N_x$, where (m)=Al, Mo, Ta, Ti, V, or W, (m')=B, Si, or Al, and (m) and (m') are different elements, are provided. Some embodiments begin by forming a stack of constituent layers of complementary compositions, then annealing the stack to interdiffuse the layers and form the ternary metal nitride. The complementary compositions of the constituent layers may be a metallic form of one of the metals and a binary nitride of the other metal, or alternatively the binary nitrides of each of the metals (for example, $(m)N_y$ and $(m')$, $(m)$ and $(m')N_z$, or $(m)N_y$ and $(m')N_z$). The constituent layer stack includes at least one binary nitride layer of one of the metals and at least one layer that includes either the other metal or its binary nitride, but may also include more layers.

The constituent layers may be 2-5 nm thick, formed by sputtering, a type of physical vapor deposition (PVD) from separate (m)- and (m')-containing targets. The targets may be nitride targets or metal targets. Power density at the sputtering target may be 8-12 W/cm$^2$, e.g., 10 W/cm$^2$. The sputter gas may include $N_2$ or another nitrogen-containing gas.

The annealing may be at a temperature of 500-1000° C. for a duration of 10 seconds to 10 minutes (e.g., 750° C. for 1 minute), and may be done in a forming gas (H2-N2 mixture) ambient. In some embodiments, the interdiffusion of the constituent layers may be done in an annealing process already required by another device component (e.g., a diode).

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

A brief description of ReRAM cells is provided for context of ReRAM embedded resistors. A ReRAM cell includes a dielectric layer with variable resistance (VR layer). Although dielectrics are normally insulating, conductive paths ("filaments") may be formed in dielectric layers by a sufficiently high electric field, e.g., by applying a voltage across the layer. During operation, these filaments may be broken ("reset," raising the layer's resistance) or restored ("set," lowering the layer's resistance) by applying sufficient voltages ("write" voltages). Without being restricted to any particular theory, it is believed that variable resistance results, at least in part, from migration of electrical (charge-carrying) defects into or out of the filaments, either within the variable resistance layer or between the VR layer and nearby layers such as source electrodes or defect access layers.

DETAILED DESCRIPTION OF EXAMPLE EMBODIMENTS

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

Unless the text or context clearly dictates otherwise: (1) By default, singular articles "a," "an," and "the" (or the absence of an article) may encompass plural variations; for example, "a layer" may mean "one or more layers." (2) "Or" in a list of multiple items means that any, all, or any combination of less than all the items in the list may be used. (3) Where a range of values is provided, each intervening value is encompassed. (4) "About" or "approximately" contemplates up to 10% variation. "Substantially equal," "substantially unchanged" and the like contemplate up to 5% variation, except that "substantially constant resistivity" is defined as less than one order of magnitude of resistivity change. (5) Ordinals such as "first" and "second" are used herein only for differentiation and do not imply any specific spatial or temporal order.

"Horizontal" defines a plane parallel to the plane or surface of the substrate. "Vertical" shall mean a direction perpendicular to the horizontal. "Above," "below," "bottom," "top," "side" (e.g. sidewall), "higher," "lower," "upper," "over," and "under" are defined with respect to the horizontal plane. "On" indicates direct contact; "above" and "over" allow for intervening elements. "On" and "over" include conformal configurations covering feature walls oriented in any direction.

"Variable resistance," e.g., in a ReRAM resistive-switching layer, herein means a resistance that is reversibly switched between at least two stable states by "write" signals, but remains approximately constant in response to "read" signals. "Constant resistance," e.g., in a ReRAM embedded resistor layer, herein means a resistance that remains approximately constant in response to either "read" or "write" signals.

Figure 1A:
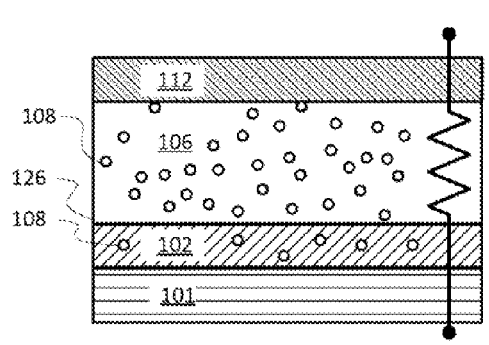
FIGS. 1A and 1B conceptually illustrate initial filament formation in the variable-resistance layer of a ReRAM cell.
Figure 1B:
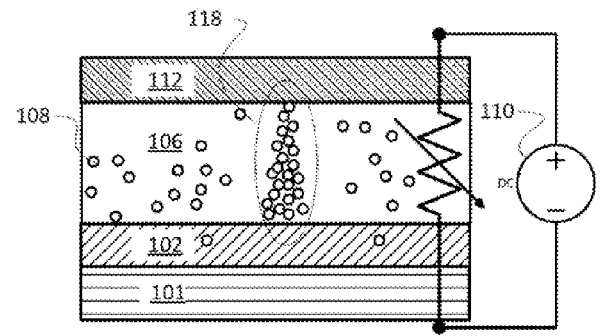

FIGS. 1A and 1B conceptually illustrate initial filament formation in the variable-resistance layer of a ReRAM cell. FIG. 1A is a schematic representation of layers in a ReRAM cell before any filaments are formed. Although some ReRAM cells include additional layers, the illustration is simplified to show only substrate 101 (which may include other structures and layers), electrodes 102 and 112, and VR layer 106 between the electrodes. Electrode 102 and 112 are usually conductive layers. In this example, top electrode 112 is an inert electrode that does not react with, or exchange material or defects with, VR layer 106. In this example, bottom electrode 102 is a reactive or "source" electrode that may act as a source or reservoir of electrically active defects 108. In some embodiments, the bottom electrode may be inert and the top electrode may be reactive. Inert electrodes may be made of inert materials (e.g., noble metals) or may be rendered inert by a barrier layer between the electrode and the VR layer (e.g., polycrystalline silicon with a silicon oxide barrier layer). Reactive electrodes may be made of any sufficiently conductive material that provides the desired mobile defects; for example, titanium nitride for oxygen vacancies, or silver or copper for metal ions.

Defects 108 may travel through "reactive interface" 126 between reactive electrode 102 and VR layer 106, e.g., when mobilized by an electric field from an applied voltage. Defects 108 may be, by way of non-limiting example, metal ions, vacancies (e.g., oxygen vacancies), interstitial atoms, stress-induced lattice dislocations. Either alternatively or in addition, VR layer 106 may be formed with defects 108. If sufficient defects to form a filament are available in VR layer 106, both electrodes may be inert electrodes. VR layer 106 may be a high-k or low-k dielectric, a dielectric stack or, in some embodiments, a low-conductivity semiconductor. With no filament formed, the position, number, and distribution of defects 108 is not conducive to electron tunneling between bottom electrode 102 and top electrode 112.

In FIG. 1B, a voltage source 110 applies a forming-voltage pulse to electrodes 102 and 112, mobilizing defects 108 to form a filament 118 in VR layer 106. The defects may be gathered from an original distribution of VR layer 106, or they may enter VR layer 106 from a reactive electrode 102 (or some other type of defect-access layer), or they may be created in VR layer 106 by interaction of the electric field with another feature of the material, or any combination. In filament 118, the defects are sufficiently close together that electrons may tunnel from defect to defect through the VR layer from one electrode to the other. In some embodiments, the forming operation includes heating to enhance mobility of the defects within ReRAM cell 100.

In general, the forming operation is a one-time fabrication step that converts the original dielectric of VR layer 106 to a variable resistive material. Afterward, in operating the ReRAM cell, a lesser "reset" voltage may be applied to break at least the weak part of the filament and raise the resistance of the VR layer to a high resistance state (HRS), a lesser "set" voltage may be applied to restore the broken part of the filament and lower the resistance of the VR layer to a low resistance state (LRS), or an even lesser "read" voltage may be applied to sense the resistance of the VR layer without changing it. Moving, creating, or destroying the defects requires energy, but leaving them in place does not; therefore, the VR layer is non-volatile, retaining its written LRS or HRS state if the cell is unpowered. In some embodiments, the resistance values of the HRS and LRS are repeatable within ±20% or less.

Figure 2:
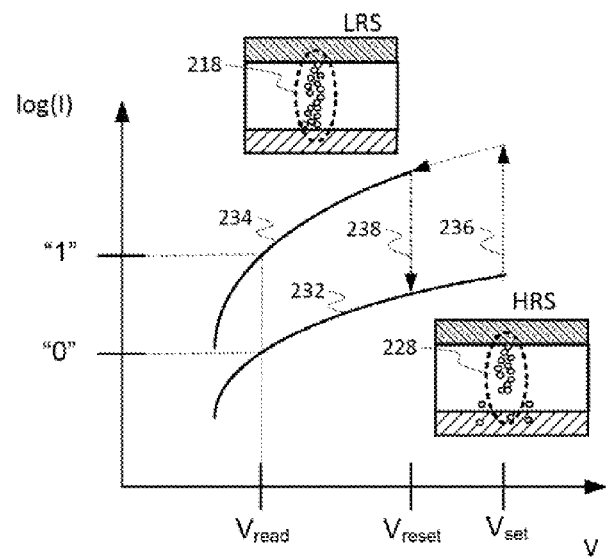
FIG. 2 is an example I-V plot for reading and writing of a ReRAM cell.

FIG. 2 is an example I-V plot for reading and writing of a ReRAM cell. Specifically, FIG. 2 is a plot of current passing through a unipolar ReRAM cell as a function of applied voltage according to some embodiments. The cell's response when the VR layer is in its HRS, with a broken filament 228, is plotted as curve 232. The cell's response when the VR layer is in its LRS, with a restored filament 218, is plotted as curve 234.

With two possible resistive states, the cell can store one bit of data. Some ReRAM cells may have three or more resistance states to enable multi-bit storage in a single cell. To change the stored value, a write voltage $V_{SET}$ or $V_{RESET}$ is applied to the cell. $V_{RESET}$ breaks complete filament 218 into broken filament 228, and $V_{SET}$ restores broken filament 228 to a complete filament 218. In a unipolar cell as illustrated here, $V_{SET}$ and $V_{RESET}$ have the same polarity. In a bipolar cell, $V_{SET}$ and $V_{RESET}$ have opposite polarities.

To read the stored value, a sensing or "read" voltage $V_{READ}$ is applied across the cell and the output current is measured. Because of Ohm's law, V=IR, for a given $V_{READ}$ the output current I depends on the cell resistance R, which depends on whether the VR layer is in its LRS or its HRS. In the illustrated example, the LRS corresponds to logic "1" and the HRS corresponds to logic "0," although some embodiments may reverse the correspondences.

ReRAM cells may be switched between LRS and HRS (rewritten) many times. Between switching events, any number of read operations may be performed. In some embodiments, the set voltage ($V_{SET}$) is between about 100 mV and 10V; e.g., between about 500 mV and 5V. The length of set voltage pulses ($t_{SET}$) may be less than about 100 milliseconds, less than about 5 milliseconds, or less than about 100 nanoseconds. The read voltage ($V_{READ}$) may be between about 1/10 and 1/2 of $V_{SET}$. In some embodiments, the currents sensed during read operations are greater than about 1 mA, or even greater than about 5 mA to allow for a fast detection of the logic state by small sense amplifiers. The length of a read voltage pulse ($t_{READ}$) may be comparable to the length of a set voltage pulse ($t_{SET}$) or may be shorter. ReRAM cells preferably can switch between LRS and HRS at least about $10^3$ times or, more desirably at least about 10' times without failure. They preferably retain their data for at least about 5 years or, more desirably, at least about 10 years at temperatures up to 85° C. under constant application of $V_{READ}$. In some embodiments, low current leakage, such as less than about 40 A/cm² measured at 0.5 V per 20 Å of oxide thickness in HRS, may also be preferred.

Figure 3:
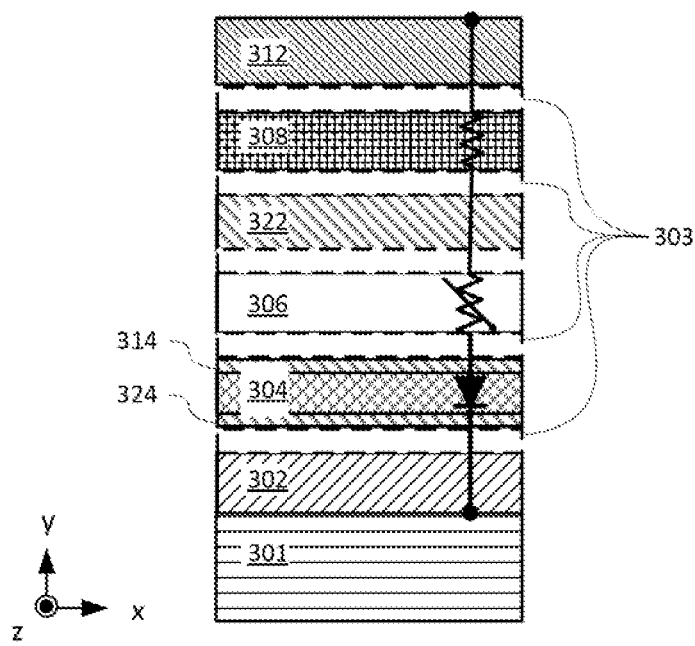
FIG. 3 conceptually illustrates an example of a ReRAM cell.

FIG. 3 conceptually illustrates an example of a ReRAM cell. The ReRAM cell may be connected to other cells or other devices by a first signal line 302 and a second signal line 312. Signal lines 302 and 312 may also be the ReRAM cell's electrodes, or other electrode layers may be included. Besides VR layer 306, various other layers may be between signal lines 302 and 312, such as embedded resistor (ER) layer 308, optional current-steering element 304, or optional intermediate electrode 322. Generally, the elements formed by the layers in the ReRAM cell are effectively connected in series.

The footprint (i.e., cross-sectional area in the x-z plane of FIG. 3) of the layers disposed between signal lines 302 and 312 may be between about 20-100 nm². These elements may appear in any order within the stack; for example, in some embodiments ER layer 308 may be between substrate 301 and VR layer 306.

Various interface layers 303 may optionally be formed between any of the cell elements. For example, a conductive interface layer may be formed between electrode 322 and ER layer 308 to provide a desired type of electrical contact (e.g., ohmic or Schottky) between electrode 322 and ER layer 308. Other non-limiting examples of interface layers include barrier layers, buffer layers, doping layers, nucleation layers, adhesion layers, getter layers, filament-shaping layers, and defect-access layers. Interface layers may be of any suitable thickness to perform their intended function. Some embodiments of ReRAM cells may omit interface layers; for example, ER layer 308 may directly interface VR layer 306. In some embodiments, VR layer 306 directly interfaces two conductive layers operable as electrodes.

Some layers in ReRAM cells may perform multiple functions. In the example illustrated in FIG. 3, a portion 314 of current steering element 304 is also operable as another intermediate electrode for VR layer 306. In some embodiments, a portion of embedded resistor 308 may be operable as an intermediate electrode, optionally replacing intermediate electrode 322. In any of these configurations, one electrode on one side of VR layer 306 may be an inert electrode (not exchanging defects with VR layer 306) while an electrode on the other side of VR layer 306 may be reactive (exchanging defects with variable resistance layer 306).

First signal line 302 and second signal line 312 may be made from conductive materials, such as n-doped polysilicon, p-doped polysilicon, titanium nitride, ruthenium, iridium, platinum, and tantalum nitride. The signal lines may have a thickness of less than about 100 nanometers, such as less than about 50 nanometers and even less than about 10 nanometers. Thinner electrodes may be formed using atomic layer deposition (ALD) techniques.

Intermediate electrode 322, and other layers operable as electrodes, may be fabricated from conductive materials with desirable work functions, such as p-type or n-type polysilicon, transition metals, or transition metal alloys, nitrides, or carbides. Examples of electrode metals include titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir) ruthenium (Ru). Alloys, nitrides, carbides, or silicon-doped versions of these metals may alternatively be used. Intermediate electrode 322 may be 5-500 nm thick.

Current steering element 304, if present, may be a p-n junction diode, p-i-n diode, transistor, or similar device. In some embodiments, current steering element 304 may include two or more layers of semiconductor materials, such as two or more doped silicon layers, that are configured to direct the flow of current through the device. In the example illustrated in FIG. 3, current steering element 304 may include a bottom p-doped polysilicon portion 324, which may interface first signal line 302, a top n-doped polysilicon portion 314, which may interface variable resistance layer 306 and may be operable as an inert electrode. Current steering element 304 may be a diode that includes a p-doped silicon layer, an un-doped intrinsic layer, and an n-doped silicon layer. The overall resistance of current steering element 304 may be between about 1 kilo-Ohm and about 100 Mega-Ohm. The overall resistance generally depends on the type of current steering element 304 and direction of the intended current flow through it (e.g., forward- or reverse-biased). Some current steering elements may require a post-deposition treatment, such as a rapid thermal anneal, for activation.

VR layer 306 may be a dielectric or semiconducting material that can be reversibly switched between two or more stable resistive states. In some embodiments, VR layer 306 a bandgap of about 4 eV or greater. The high bandgap may improve data retention, reduce the current leakage by reducing the amount of trapped charge, or increase the barrier that charge carriers must during read, set, and reset operations. Material examples include hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). Other suitable materials include titanium oxide ($TiO_x$), nickel oxide ($NiO_x$), and cerium oxide ($CeO_x$). Semi-conducting p-type or n-type metal oxides, such as zinc oxides ($Zn_xO_y$), copper oxides ($Cu_xO_y$), and their nonstoichiometric and doped variants, may also be used. VR layer 306 may be about 1-100 nm thick and be deposited by processes including, but not limited to, ALD, CVD, PVD, or plasma-enhanced processes.

ER layer 308 may include a ternary metal nitride, such as a metal silicon nitride, a metal aluminum nitride, or a metal boron nitride. Non-limiting examples of materials suitable for ER layer 308 include aluminum boron nitride ($AlBN_x$), aluminum silicon nitride ($AlSiN_x$), molybdenum aluminum nitride ($MoAlN_x$), molybdenum boron nitride ($MoBN_x$), molybdenum silicon nitride ($MoSiN_x$), tantalum aluminum nitride ($TaAlN_x$), tantalum boron nitride ($TaBN_x$), tantalum silicon nitride ($TaSiN_x$), titanium aluminum nitride ($TiAlN_x$), titanium boron nitride ($TiBN_x$), titanium silicon nitride ($TiSiN_x$), vanadium aluminum nitride ($VAlN_x$), vanadium boron nitride ($VBN_x$), vanadium silicon nitride ($VSiN_x$), tungsten aluminum nitride ($WAlN_x$), tungsten boron nitride ($WBN_x$), or tungsten silicon nitride ($WSiN_x$).

The silicon, aluminum, boron and/or nitrogen content of ER layer 308 tends to increase its resistivity, while the base metal (e.g., tantalum, titanium, tungsten, molybdenum) helps to maintain a stable resistivity and a high breakdown voltage through the forming operation and subsequent repeated read and write cycles. Ternary metal nitrides are often stable under high process temperatures, such as the typical 750° C., 60 second anneal used to activate some diodes, including some diode-type current steering elements 304. In some embodiments, ER layer 308 retains characteristics such as resistivity or amorphousness after annealing at about 500-1000° C. for between about 10 seconds and 10 minutes. Such annealing conditions may be used, for example, to activate diodes or other elements on the same substrate. ER layer 308 may be between about 1 nm and 50 nm thick.

During read/write operation of the ReRAM cell, ER layer 308 may maintain a substantially constant resistivity under electric fields up to about 12 MV/cm. In some embodiments, the operating resistivity of ER layer 308 is between about 0.1-40 Ω-cm. The resistivity may be selected to provide a desired resistance at the planned device dimensions. At least to first order, $$R = \frac{\rho L}{A}$$

where R=resistance, ρ=resistivity, L=layer thickness (y-direction in FIG. 3) and A=footprint area (e.g., 20-100 nm²). Atomic ratios of one or more metals to aluminum, silicon, or boron in ER layer 308 may be manipulated to produce the desired resistivity (more Al, Si or B generally produces a higher resistivity). Often, a higher nitrogen content also results in higher resistivity. The concentration of nitrogen may be between 10 percent atomic and 80 percent atomic.

Those skilled in the art will recognize that a ReRAM ER layer is merely one illustrative example of an application for ternary metal nitride thin-film resistors, and that the materials and methods described herein may be used in other thin-film devices with similar requirements.

Deposition methods for ternary metal nitride resistive layers include ALD, CVD, and plasma-enhanced variations as well as PVD techniques such as sputtering. However, ternary metal nitrides can be challenging to deposit in a fully-compounded form. ALD and CVD precursors for some of the materials may be very slow to react with nitrogen and intolerant of some process conditions, such as high temperatures, that may otherwise promote nitrogen reactions. PVD (e.g., sputtering targets) made of compound metals or metal nitrides may be brittle, porous, or otherwise prone to depositing macroscopic particles along with the desired atoms or molecules. Some compound targets are also prone to an angular variation in sputtered composition, causing an unintended variation of the (m)/(m') ratio on different parts of the substrate.

Separate constituent components of ternary metal nitrides, such as metals and binary (single-metal) nitrides, however, are generally easier to deposit. Therefore, ternary metal nitride films with higher nitrogen content may be easier to create by depositing thin constituent layers of complementary component materials (e.g., by sputtering), then causing the constituent layers to interdiffuse and form the ternary nitride (e.g., by annealing).

The complementary materials may include a binary nitride of each of the metals, or a binary nitride of one of the metals and a pure form of the other metal. For example, if the desired ternary metal nitride is $TaSiN_x$, the constituent layers may be $TaN_y$ and $SiN_z$, or $TaN_y$ and Si, or Ta and $SiN_z$. Expressed another way, the constituent layers for $(m)(m')N_x$ are $(m)N_y$ and $(m')N_z$, where at least one of y>0, z>0, or both.

Figure 4:
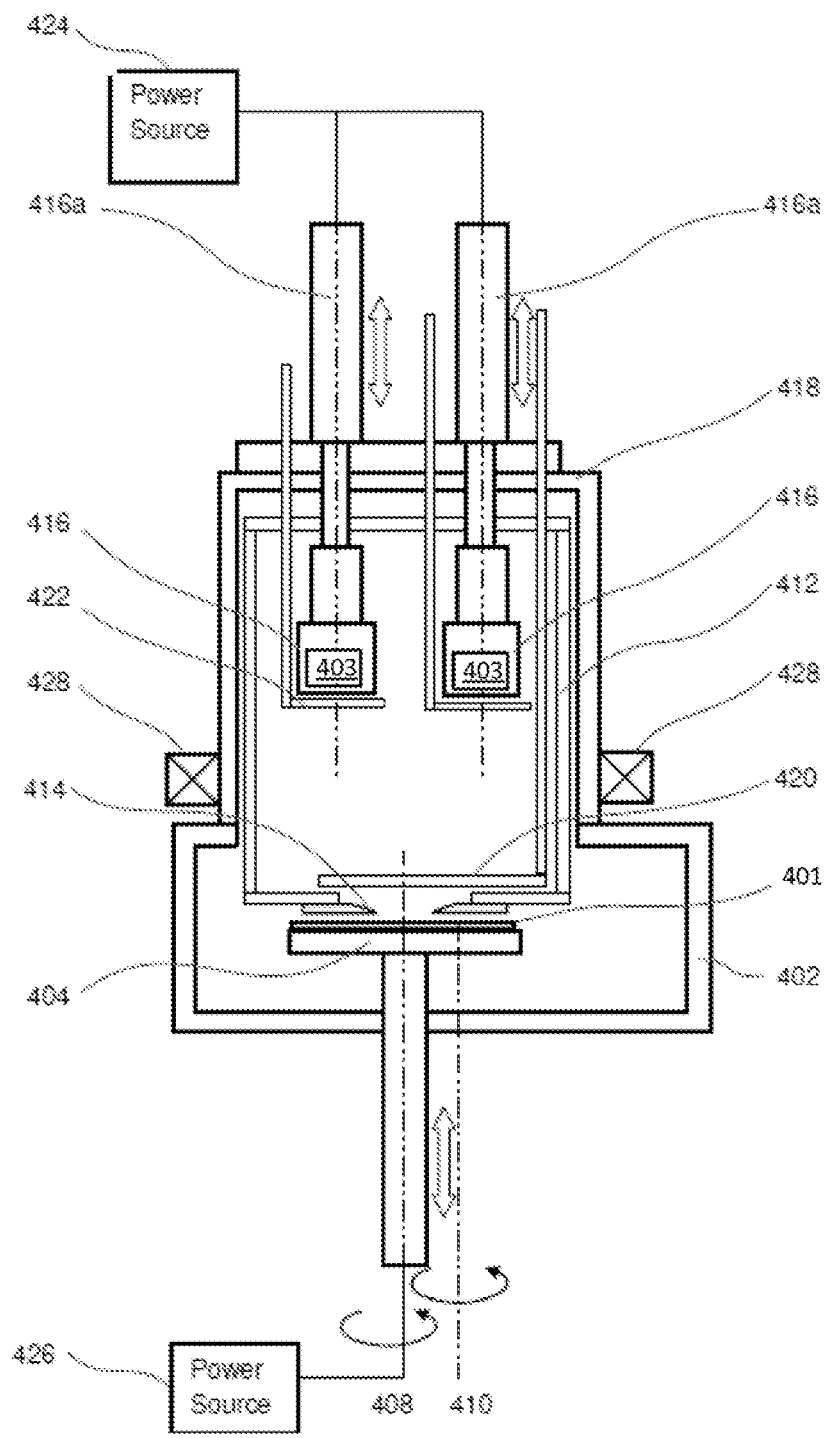
FIG. 4 is a block diagram of an example of a process chamber with dual sputter guns.

FIG. 4 is a block diagram of an example of a process chamber with dual sputter guns. Other types of process or deposition chambers may alternatively be used. The illustrated chamber includes a bottom chamber portion 402 and a top chamber portion 418. A substrate support 404 is configured to hold a substrate 401 in the bottom chamber portion 402. Substrate support 404 may include a vacuum chuck, an electrostatic chuck, or other known substrate support mechanisms. Substrate 401 may be any suitable size, shape, and material, and may include pre-existing layers or structures.

Substrate support 404 may be configured to rotate around its own central axis 408 ("rotation" axis), and revolve around a displaced axis 410 ("revolution" axis). Alternatively, other mechanisms for lateral motion, such as XY tables, may be used. In addition, substrate support 404 may move in a vertical direction. Any known drive mechanisms, including but not limited to magnetic drives, linear drives, worm screws, lead screws, and differentially pumped rotary feeds, may provide the motion. In addition, substrate support 404 may include heating and or cooling to control the temperature of substrate 401. Additionally or alternatively, the temperature of the chamber may be controlled by controlling the temperature of the chamber walls or some other component.

The chamber in FIG. 4 includes two sputter guns 416 housed in top chamber portion 418, although in practice any number of sputter guns may be included. Each sputter gun 416 holds a target 403 made of a material to be deposited on substrate 401. During deposition, targets 403 are bombarded by energetic particles, such as ions from a plasma or other ion source. Ions striking target 403 initiate collision cascades in the target that result in ejection of atoms or molecules of the target material. The ejected target material is deposited on an exposed surface of substrate 401.

The sputter guns 416 may be vertically movable to be lifted from the slots of the shield. Arm extensions 416a may be attached to a drive, e.g., lead screw, worm gear, etc. to vertically move sputter guns 416 toward or away from top chamber portion 418. Alternatively or additionally, pivotal attachment to arm extensions 416a may adjust the tilt of the sputter guns relative to a vertical axis. In some embodiments, sputter guns 416 are tilted so that a normal reference line extending from a planar surface of target 403 intersects substrate 401 near its outer periphery. In some embodiments, the tilt angle may be varied to accommodate variations of target size, target-to-substrate spacing, target material, process power/pressure, and the like. Each process gun may also include a gun shutter 422 to isolate its target 403 when deposition from that target is not desired, and/or to cover the opening when a process gun 416 is lifted.

Power source 424 provides power for sputter guns 416. For example, power source 424 may supply direct current (DC) continuous power, DC pulsed power, radio frequency (RF) power, or DC-RF imposed power. Power source 426 provides power to bias the substrate support 404. Power sources 424 and 426 may be controlled by a controller (not shown). In some embodiments, the output of the power source 426 is synchronized with the output of power source 424.

Top chamber portion 418 may include a process kit shield 412 to confine plasma generated by sputter guns 416 to a confinement region over a portion of substrate 401. Sputtered material is deposited on the portion of substrate 401 under aperture 414 in the base of process kit 412. An aperture shutter 420 may be movable to partially or wholly cover aperture 414, thereby further confining or preventing deposition on substrate 401. In some embodiments, process kit shield 412 or a section containing aperture 414 may be movable within the chamber or removable from the chamber.

An auxiliary magnet 428 may be disposed around an external periphery of the chamber between the bottom surfaces of sputter guns 416 and the top surface of substrate support 404. In some embodiments auxiliary magnet 428 may be proximate to, or even integrated with, substrate support 404. Auxiliary magnet 428 may be a permanent magnet or an electromagnet. In some embodiments, auxiliary magnet 428 improves ion guidance as the magnetic field above substrate 401 is re-distributed or optimized, or provides more uniform distribution of charged species over an exposed portion of the substrate.

With controllable temperature over a sufficient range, embodiments of the invention allow for both sputter deposition and annealing to be performed in the same process chamber. Alternatively, sputter deposition may be done in one chamber and the substrate may be moved to another chamber for annealing.

Figure 5:
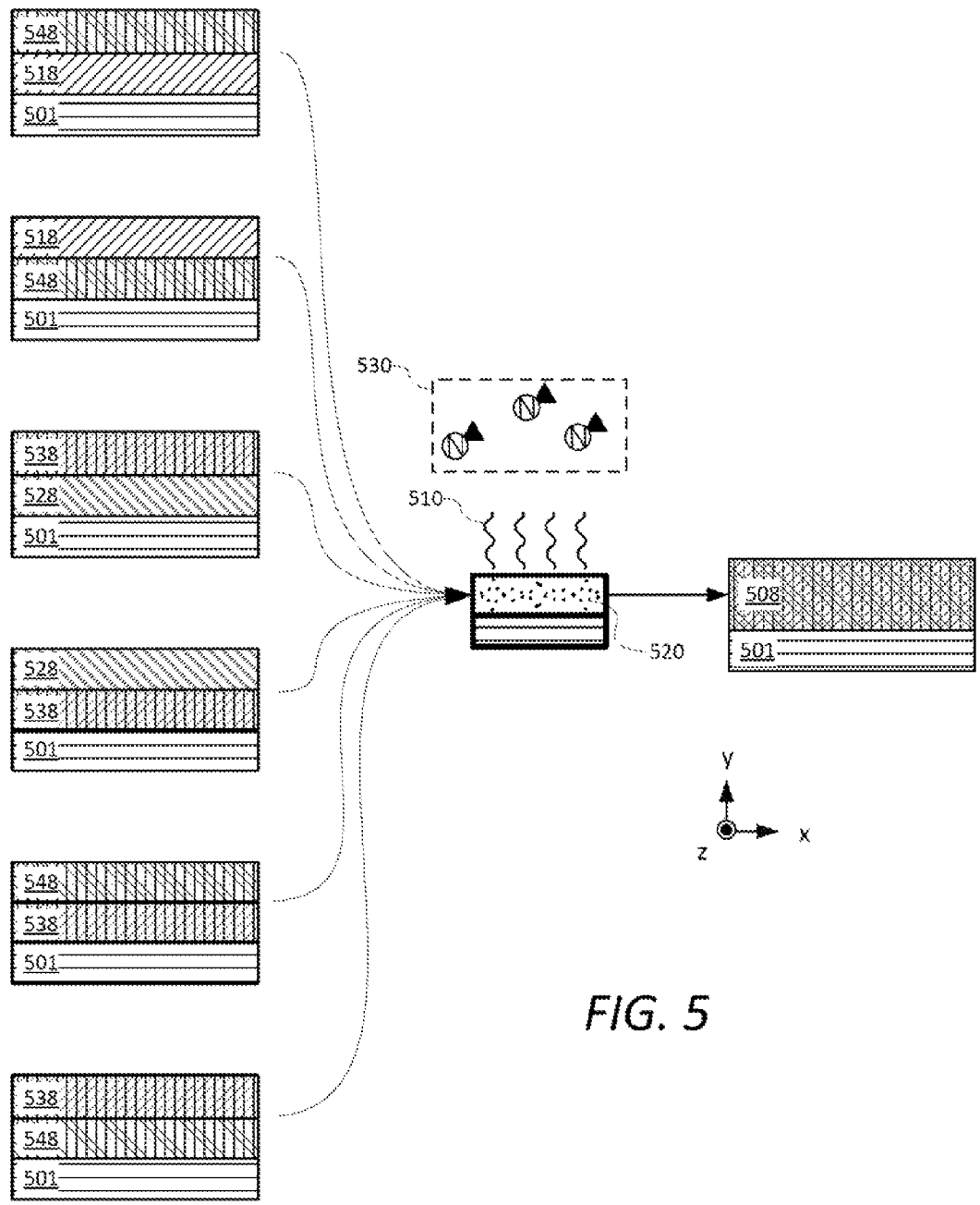
FIG. 5 conceptually illustrates formation of a ternary metal nitride layer by annealing constituent layers.

FIG. 5 conceptually illustrates formation of a ternary metal nitride layer by annealing constituent layers. The graphic symbols used for differentiating the layers are not intended to realistically represent particular atoms, molecules, or morphologies. For example, a periodic-looking fill pattern may nevertheless represent a polycrystalline or amorphous material.

In FIG. 5, several different embodiments of constituent layer stacks may be formed on substrate 501, then annealed to interdiffuse the layers to form a ternary metal nitride layer 508 of composition $(m)(m')N_x$ on substrate 501. Substrate 501 may include other layers or structures beneath the illustrated layers. For example, substrate 501 may include a signal line similar to first signal line 302 in FIG. 3, or some other interconnect structure. If ternary metal nitride layer 508 is part of a ReRAM stack, substrate 501 may also include one or more of a current steering element, a VR layer, an electrode, or an interface layer of any of the various types described with reference to FIG. 3.

The constituent layers in the initial stack may include a metallic (m) layer 518 with a binary nitride $(m')N_z$ layer 548, a metallic (m') layer 528 with a binary nitride $(m)N_y$ layer 538, or a binary nitride $(m)N_y$ layer 538 with a binary nitride $(m')N_z$ layer 548, deposited in any order. In some embodiments, each of the constituent layers 518, 528, 538, and 548 is about 2-5 nm thick. Although the illustrated examples show constituent layers of roughly equal thickness, in some embodiments they may have different thicknesses.

In some embodiments, at least one of the constituent layers is sputtered from a target of composition (m), (m'), $(m)N_y$, or $(m')N_z$. In some embodiments, the sputtering may be performed in a nitrogen-containing ambient (e.g., the ambient may include nitrogen gas $N_2$ or another nitrogen-containing gas such as $NH_3$). In some embodiments, the layers may be sputtered from different sputter guns in a single chamber, as discussed with reference to FIG. 4.

During the annealing, heat 510 causes interdiffusion 520 of the materials from the constituent layers 518, 528, 538, or 548 to form ternary metal nitride layer 508. In some embodiments, ternary metal nitride layer 508 is amorphous after the annealing (e.g., less than 20% crystalline as measured by X-ray diffraction). Optionally, the annealing may be done in a nitrogen-containing ambient 530 containing either nitrogen gas $N_2$ or a nitrogen-containing gas such as $NH_3$. If nitrogen-containing ambient 530 is used, some of the ambient nitrogen may react with the materials in the interdiffusing layers during the annealing to raise the nitrogen content of the resulting ternary metal nitride layer 508. In some embodiments, the annealing may be done in the same chamber as the deposition (e.g., a chamber like the example of FIG. 4). Alternatively, the annealing may be done in a different chamber.

In some embodiments, the interdiffusion is very thorough so that the (m)/(m') weight ratio of ternary metal nitride layer 508 varies by less than 20% in the x, y, or z direction. Alternatively, in some embodiments the interdiffusion may be incomplete to produce a gradient of the (m)/(m') weight ratio with depth (y-direction). For example, ternary metal nitride layer 508 may be made to have a higher (m)/(m') weight ratio, and thereby a higher conductivity, at one or more interfaces with other layers, compared to the (m)/(m') weight ratio and conductivity elsewhere in the layer. The depth-wise composition gradients are controlled by the composition, thickness, and distribution of the constituent layers and by the annealing time and temperature. For example, the same set of layers may be thoroughly interdiffused for uniform composition after annealing above a threshold temperature for longer than a threshold time, but they may be incompletely interdiffused for a gradient composition if the annealing is stopped after a shorter time or performed at a lower temperature.

Nitrogen content may likewise be uniform throughout the layer, or alternatively may vary with depth. Besides the variables that control the (m)/(m') weight ratio, the nitrogen distribution may be additionally manipulated by the presence, composition, and concentration of nitrogen-containing gases during deposition of the constituent layers, during annealing, or both.

Although the illustrated examples show only two constituent layers in each stack, three or more constituent layers may be deposited and annealed in the same manner. The additional constituent layers may include (m) or (m'), but their nitrogen content or thickness may be different from the first two constituent layers. For example, a binary nitride $(m')N_z$ layer 548 may be formed, followed by a binary nitride (m)N$_y$ layer 538, followed by a metallic (m') layer 528, or other variations.

Figure 6:
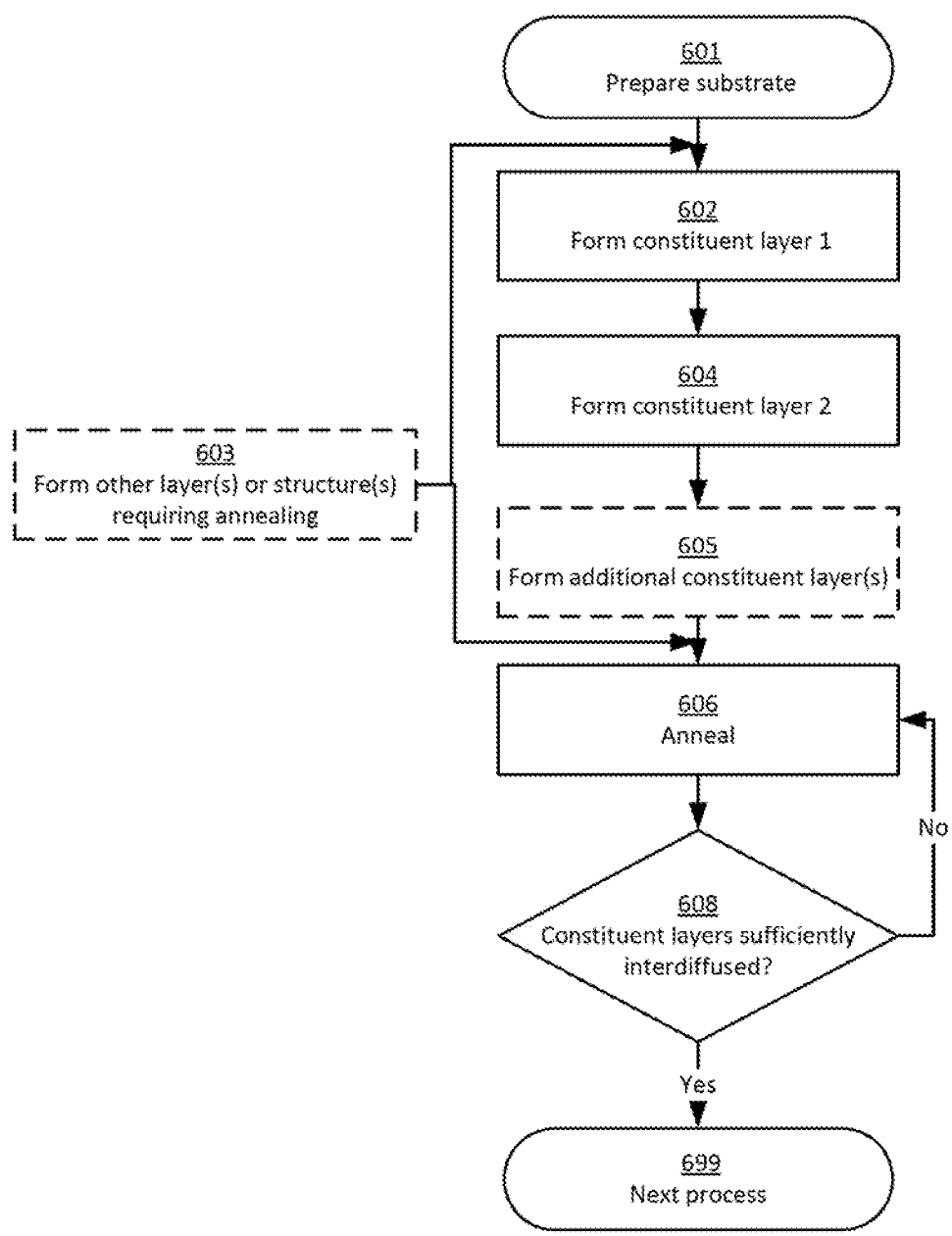
FIG. 6 is a flowchart of an example process for forming a ternary metal nitride resistive layer.

FIG. 6 is a flowchart of an example process for forming a ternary metal nitride resistive layer. Step 601 of preparing the substrate may include cleaning, degassing, some other pre-treatment, and/or formation of structures that will be beneath the resistive layer, such as interconnects or other layers that may include an electrode, a VR layer, a current steering element, or an interface layer. Optionally, step 603 may involve forming one or more structures that require annealing, such as a diode that requires heat activation. Optionally, the annealing of the structures formed in step 603 may be deferred so that the other structures and the constituent stack for the resistive layer may be annealed in the same process step.

Step 602 of forming a first constituent layer may include sputtering a metallic layer (m) or (m') from a metallic target, sputtering a binary metal nitride (m)N$_y$ or (m')N$_z$ from a metal-nitride target in an inert (e.g., argon) ambient or a nitrogen-containing ambient, forming a binary metal nitride (m)N$_y$ or (m')N$_z$ by sputtering (m) or (m') from a metallic target in a nitrogen-containing ambient, or forming a layer of (m), (m'), (m)N$_y$, or (m')N$_z$ by any other suitable method such as ALD, CVD, or electrochemical deposition. For example, the sputtering may use a power density at the target of 8-12 W/cm$^2$, e.g., 10 W/cm$^2$ and the pressure may be between about 1-10 mTorr. Step 604 of forming a second constituent layer and optional step 605 of forming additional constituent layers may include any of the same methods as step 602, provided that (1) at least one of the layers includes (m), where (m) may be Al, Mo, Ta, Ti, V, or W; (2) at least one of the layers includes (m'), where (m') may be B or Si, or alternatively (m') may be Al if (m) is not Al; and (3) at least one of the layers includes a nitride. Optionally, step 603 may be interposed after the constituent stack is completed to form one or more overlying structures that require annealing, such as a diode that requires heat activation.

Step 606 of annealing the constituent stack to interdiffuse the constituent layers into a ternary metal nitride resistive layer may be performed at a temperature between about 500° C. and 1000° C. for a duration between about 10 seconds and 10 minutes. Optionally, the annealing may be performed in a nitrogen-containing ambient such as N$_2$, forming gas (H$_2$—N$_2$ mixture), NH$_3$, or a nitrogen-containing gas mixed with one or more inert gases such as Ar. Annealing step 606 continues until the layers are sufficiently interdiffused at step 608. As discussed above, "sufficiently interdiffused" may mean that the ternary metal nitride resistive layer has a generally uniform composition throughout its thickness, or in some embodiments a desired composition gradient may remain. After annealing, next process 699 may commence.

Optionally, annealing step 606 may additionally meet another structure's need for heat treatment; for example, it may heat-activate a diode formed in step 603. As an example, some diodes, including many ReRAM current-steering elements, are activated by annealing at 750° C. for 1 minute in a forming-gas ambient. This same anneal process may serve to interdiffuse the constituent stack for the resistive layer. The compositions, thicknesses, and distribution of the constituent layers, and the composition of the ambient during deposition and annealing, may be selected to produce the desired composition profile for the ternary metal nitride resistive layer after an annealing step that meets the heat-treatment needs of another structure on the substrate.

Figure 7:
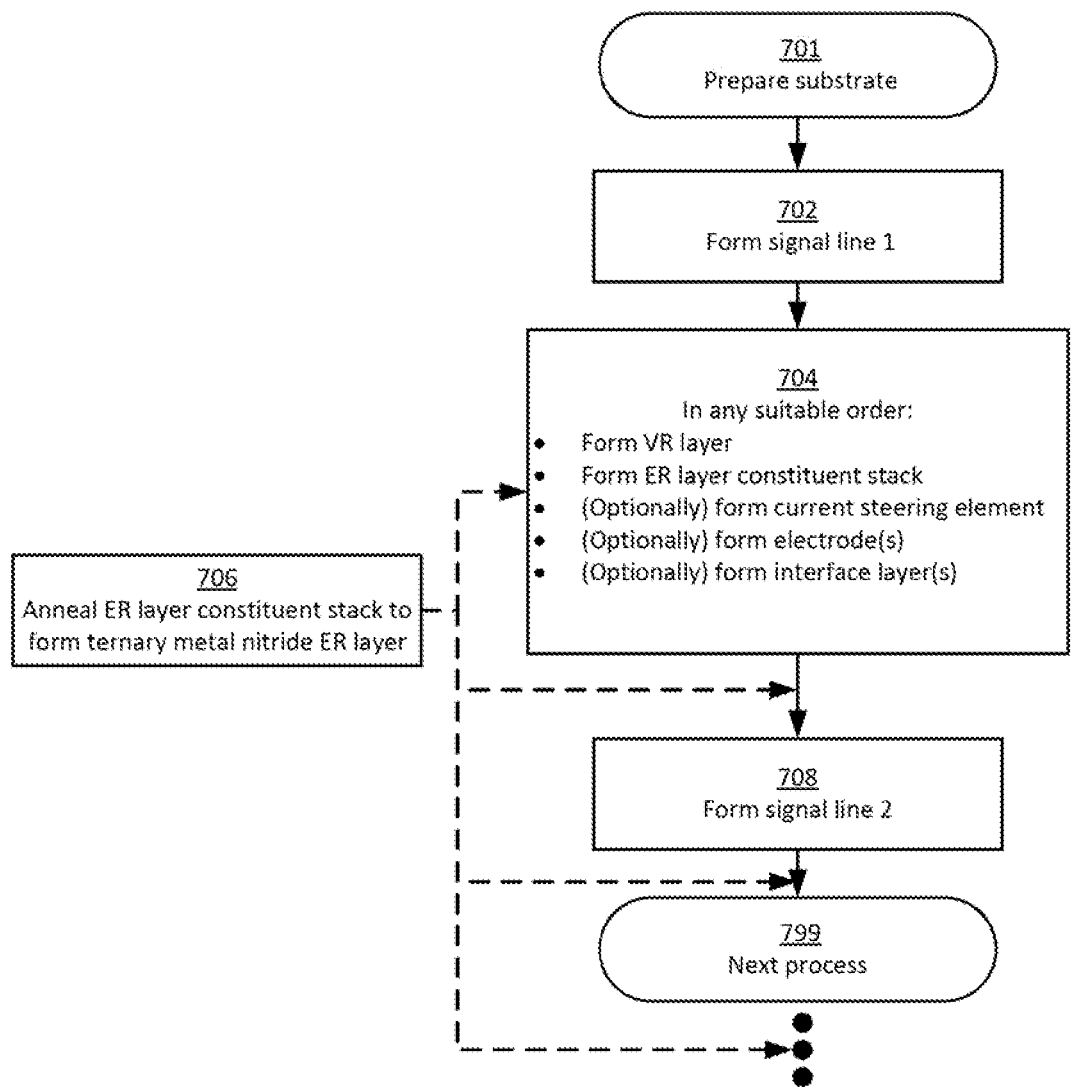
FIG. 7 is a flowchart of an example process for forming a ReRAM cell having a ternary metal nitride ER layer.

FIG. 7 is a flowchart of an example process for forming a ReRAM cell having a ternary metal nitride ER layer. Step 701 of preparing the substrate may include cleaning, degassing, some other pre-treatment, and/or formation of structures that will be beneath the ReRAM cell, such as other device layers or interconnect layers. After step 702 of forming a first signal line by any suitable known method, step 704 includes forming a VR layer, forming the constituent stack of a ternary metal nitride ER layer, and optionally forming a current steering element, one or more electrodes, and one or more interface layers. Afterward, step 708 includes forming a second signal line. These layers of the "ReRAM cell stack" may be formed in any suitable order. Before forming the second signal line in step 708, the layers of the cell stack may be patterned to divide the individual cells and a fill dielectric may be formed between the cells by methods known in the art. After the second signal line is formed, it may also be patterned by methods known in the art, e.g., as part of next process 799.

At some point after the forming the constituent stack of the ternary metal nitride ER layer in step 704, step 706 includes annealing the constituent stack to interdiffuse the materials of the constituent layers, forming the finished ternary metal nitride ER layer (with or without a composition gradient). In some embodiments, annealing step 706 may interrupt step 704 immediately after the top layer of the constituent stack is formed (e.g., to facilitate incorporation of ambient nitrogen into the exposed stack), or may be performed at any convenient later time to also anneal a later-deposited structure (e.g., a diode). For example, anneal step 706 may follow completion of the entire ReRAM cell stack of step 704, formation of the second signal line in step 708, or a subsequent process after next process 799.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A method comprising:
   forming a first layer on a substrate;
   forming a second layer over the first layer; and
   annealing a stack comprising the first layer and the second layer disposed over the substrate to form a third layer,
     wherein the third layer is formed by interdiffusion of the first layer and the second layer;
     wherein the first layer comprises a first nitride of a first metal;
     wherein the second layer comprises a second nitride of a second metal;
     wherein the second nitride is different from the first nitride; and
     wherein the third layer comprises a ternary metal nitride of the first metal and the second metal.

2. The method of claim 1, wherein the forming of the first layer or the forming of the second layer comprises sputtering from a metal target.

3. The method of claim 1, wherein the forming of the first layer or the forming of the second layer comprises sputtering from a metal target in a nitrogen-containing ambient.

4. The method of claim 1, wherein the forming of the first layer or the forming of the second layer comprises sputtering from a metal nitride target.

5. The method of claim 1, wherein the first layer and the second layer are formed by sputtering from separate targets in a single process chamber.

6. The method of claim 1, wherein the annealing is performed at a temperature between about 500° C. and about 1000° C. for a duration between about 10 seconds and about 10 minutes.

7. The method of claim 1, wherein the annealing is performed in a nitrogen-containing ambient.

8. The method of claim 1, wherein the annealing is performed at a temperature of about 750° C. for a duration of about 1 minute in a forming-gas ambient.

9. The method of claim 1, wherein a thickness of the first layer or the second layer is between about 2 nm and about 5 nm.

10. The method of claim 1, wherein the first metal comprises at least one of molybdenum, tantalum, titanium, vanadium, or tungsten and the second metal comprises at least one of boron or silicon.

11. The method of claim 1, wherein the first metal comprises at least one of boron or silicon and the second metal comprises at least one of molybdenum, tantalum, titanium, vanadium, or tungsten.

12. The method of claim 1, wherein the first metal comprises aluminum and the second metal comprises at least one of boron or silicon.

13. The method of claim 1, wherein the first metal comprises aluminum and the second metal comprises at least one of molybdenum, tantalum, titanium, vanadium, or tungsten.

14. The method of claim 1, further comprising forming a fourth layer over the second layer before the annealing.

15. The method of claim 14, wherein the fourth layer comprises at least one of the first metal or the second metal, and wherein the fourth layer inter-diffuses with the second layer during the annealing to form part of the third layer.

16. The method of claim 1, wherein a weight ratio of the first metal to the second metal varies less than 20% with depth in the third layer.

17. The method of claim 1, wherein a weight ratio of the first metal to the second metal has a gradient with depth in the third layer.

18. The method of claim 1, wherein a nitrogen content varies less than 20% with depth in the third layer.

19. The method of claim 1, wherein a nitrogen content has a gradient with depth in the third layer.

20. The method of claim 1, wherein a resistivity of the third layer is between about 0.1 and about 40 Ω-cm.

* * * * *